United States Patent [19]
Hideshima

[11] 3,949,297
[45] Apr. 6, 1976

[54] INFORMATION SIGNAL TRANSMITTING SYSTEM

[75] Inventor: Yasuhiro Hideshima, Tokyo, Japan

[73] Assignee: Sony Corporation, Tokyo, Japan

[22] Filed: July 10, 1974

[21] Appl. No.: 487,284

[30] Foreign Application Priority Data
July 19, 1973 Japan................ 48-85022

[52] U.S. Cl. ............ 325/37; 178/DIG. 15; 325/39; 325/142; 325/392; 343/228
[51] Int. Cl.².. H04B 11/00; H03K 7/08; H03B 3/18
[58] Field of Search ....... 325/37, 39, 111, 118, 142, 325/164, 183, 390, 391, 392; 178/DIG. 15, 66 A; 343/225, 228; 179/15 AW; 332/9 R, 14; 340/167 A, 206

[56] References Cited
UNITED STATES PATENTS

| | | | |
|---|---|---|---|
| 3,098,212 | 7/1963 | Creamer, Jr. ................ | 340/15 |
| 3,440,353 | 4/1969 | Salmet .......................... | 179/15 |
| 3,475,092 | 10/1969 | Harvey ........................ | 353/103 |
| 3,678,392 | 7/1972 | Houghton ..................... | 325/392 |
| 3,705,363 | 12/1972 | Okada et al. ................. | 331/174 |
| 3,858,116 | 12/1974 | Friedl et al. .................. | 325/37 |

Primary Examiner—Howard W. Britton
Assistant Examiner—Marc E. Bookbinder
Attorney, Agent, or Firm—Hill, Gross, Simpson, Van Santen, Steadman, Chiara & Simpson

[57] ABSTRACT

A system for transmitting information and accomplishing control including a transmitter and at least one receiver in which the transmitter produces an ultrasonic wave or an electrical signal and includes a circuit for modulating the ultrasonic wave or electrical signal as a function of a time interval indicative of the control signal. The modulation is varied as an exponential function so as to assure more accurate reception and decoding of the intelligence by the receiver.

11 Claims, 16 Drawing Figures

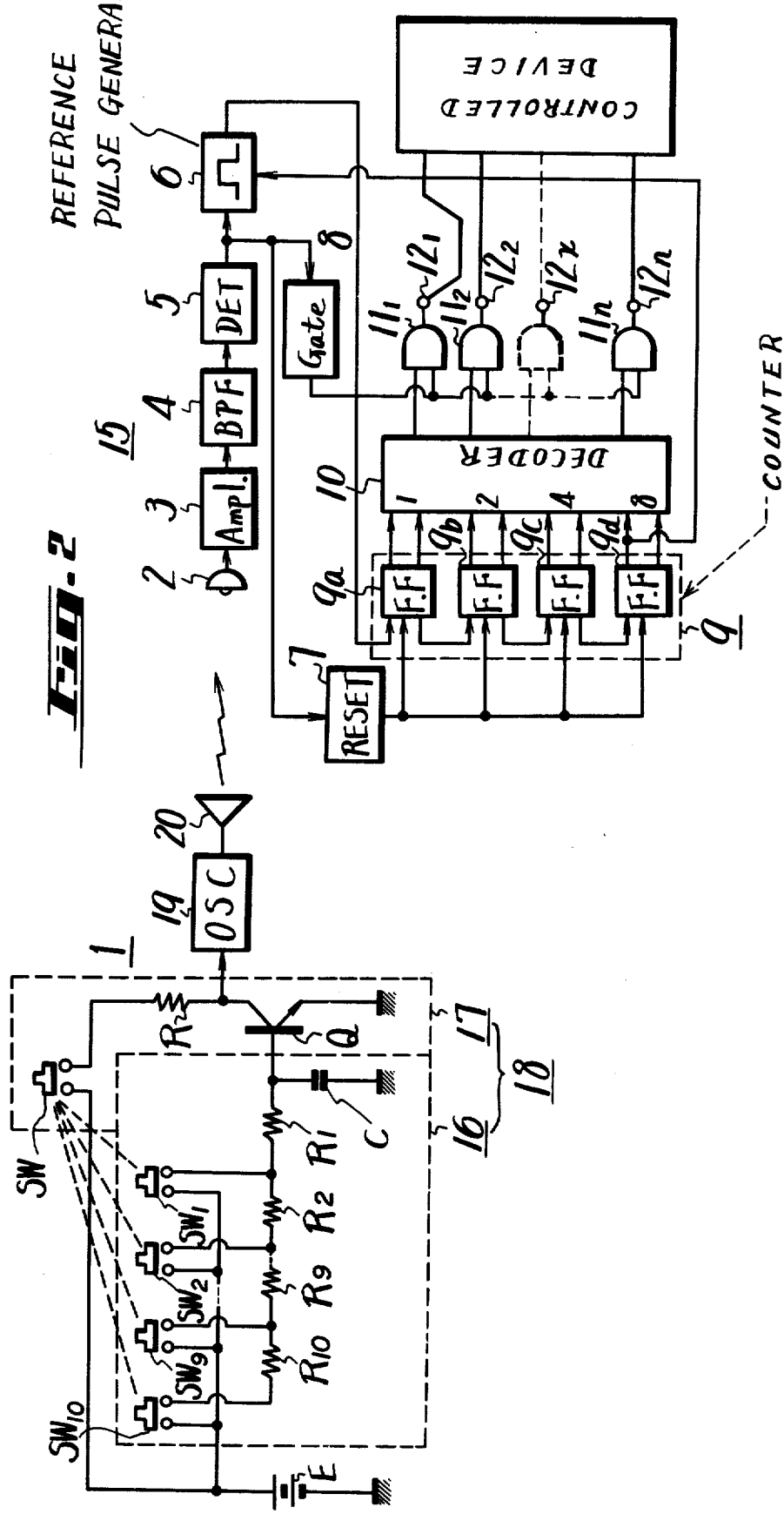

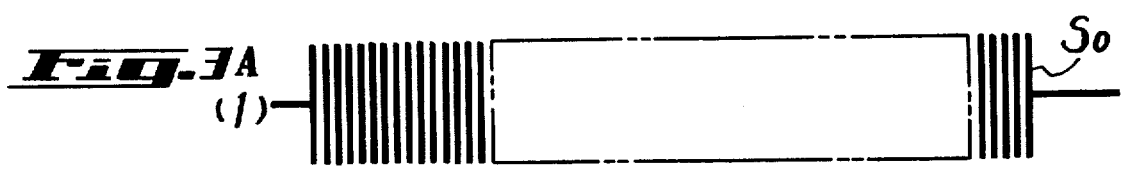
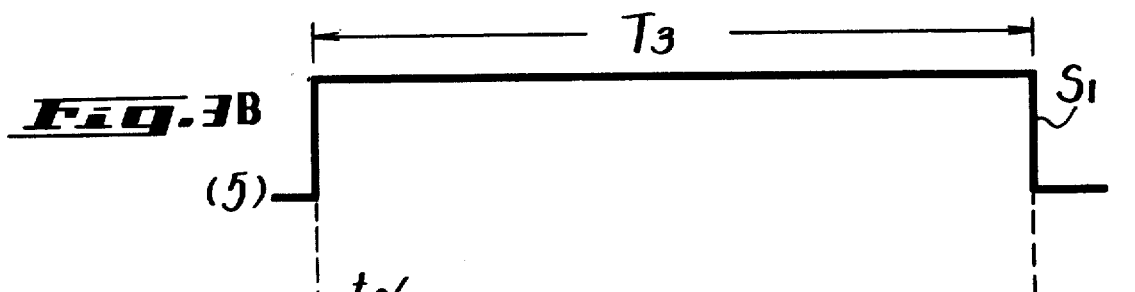
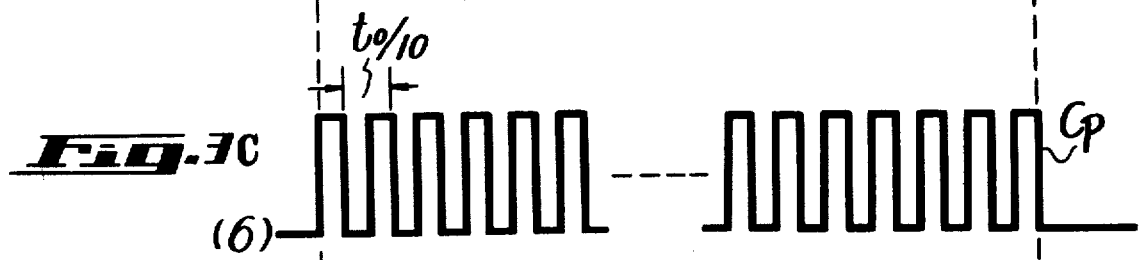

INFORMATION SIGNAL TRANSMITTING SYSTEM

BACKGROUND OF THE INVENTION

1. Field of the Invention

The present invention relates to an information transmitting and receiving system and particularly to a control system for use as remote control, as for example, in television sets.

2. Description of the Prior Art

In remote control systems for television receivers, it has been proposed to transmit control signals which might be ultrasonic or electrical waves having time intervals which differ as a function of the information to be transmitted. These signals are received and detected by counting the time duration of the incoming signals and the television receiver is controlled by the detected signals.

In such prior art remote control systems, the information content is selected to be integral multiples of a unit time interval $t_0$, as for example, by being $t_0$, $2t_0$, $3t_0$, ... but the following defect exists in such systems.

As shown in FIGS. 1A-1E, which illustrate waveforms used in prior art remote control systems, a unit time interval $t_0$ is utilized as shown in FIG. 1A where the number of $t_0$ units is indicative of the intelligence to be transmitted. FIGS. 1B-1E illustrate waveforms having different time lengths corresponding to a different intelligence to be transmitted, respectively. In the four examples, the intelligence illustrated in FIGS. 1B and 1C could be used for increasing and decreasing the volume of the sound of the television set, whereas the information illustrated in FIGS. 1D and 1E could be utilized to change the channels in either a clockwise or counter-clockwise direction, for example. It is to be particularly noted that the length of the signal illustrated in FIG. 1B is exactly twice as long as the length of the signal illustrated in FIG. 1C; and thus, there is a ratio of 2:1 between these two signals and a receiver and detector discrimate and distinguish between signal 1B and signal 1C. However, it is to be noted that signal 1D is $10t_0$ in length, whereas the signal 1E is $9t_0$ in length. These two signals have a ratio of 10:9. Thus, it is very easy for a receiver and detector to confuse the signals 1D and 1E since their ratio is very close to 1.

SUMMARY OF THE INVENTION

It is an object of the present invention to provide an information transmitting system which avoids the problems of the prior art.

Another object of the invention is to provide a remote control system which is novel and has high accuracy. Still another object is to provide an information signal transmitting system which can be used as a remote control apparatus for a television receiver.

A further object of the invention is to provide an information signal transmitting system which includes a transmitter and at least one receiver, and in which the transmitter includes an oscillator and produces a carrier wave and with means for modulating the carrier wave as a function of time which changes exponentially and wherein the receiver detects the transmitted signal for use as a control signal.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

BRIEF DESCRIPTION OF THE DRAWINGS

FIG. 2 is a block diagram illustrating an embodiment of a transmitter and a receiver according to the present invention;

FIGS. 3A-3E and FIGS. 4A-4E are waveforms utilized for explaining the present invention illustrated in FIG. 2.

DESCRIPTION OF THE PREFERRED EMBODIMENTS

Figure 1A:
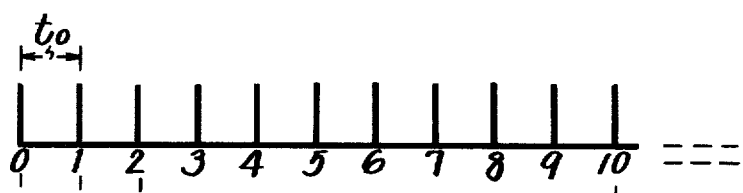
FIGS. 1A-1E are graphs showing the modulation scheme of prior art information systems.
Figure 1B:
Figure 1C:
Figure 1D:
Figure 1E:

FIG. 2 illustrates the transmitter 1 and a receiver 15 of the present invention.

The transmitter 1 includes a duration time interval variable control means 18 which is capable of exponentially varying the duration time of a transmitted signal, and wherein the time duration is indicative of information to be transmitted. An oscillator 19, which might have a frequency of, for example, 40KHz, is controlled by the control means 18 and provides an output to an electrical or ultrasonic radiator 20 which might, for example, be a ceramic resonator for radiating the output signal of the oscillator 19.

The control means 18 keys the oscillator such that its output varies as a time function of the intelligence to be transmitted. The control means 18 includes a variable time constant circuit 16 and a switching circuit 17.

The variable time constant circuit 16 consists of a plurality of series connected resistors $R_1, R_2, \ldots, R_9, R_{10}$. The output end of resistor $R_{10}$ is connected to a capacitor C which has its other side connected to ground and is also connected to the base of a transistor Q which forms a part of the switching circuit 17. A battery E has one side connected to ground and its other side connected to a first contact of a plurality of switches $SW_1, SW_2, \ldots, SW_9, SW_{10}$ which have their second terminals, respectively, connected to the resistors $R_1$ through $R_{10}$ as shown. The switching circuit 17 includes a switch SW which has one terminal connected to one side of the battery E and the other terminal connected to one side of a resistor R which has its other side connected to the collector of transistor Q. The emitter of transistor Q is connected to ground. The collector of transistor Q is connected to the oscillator 19 to control its output signal. The switches $SW_1$ through $SW_{10}$ are each ganged to the switch SW such that when any one of the switches $SW_1$ through $SW_{10}$ are closed the switch SW will also be closed simultaneously.

When a selected one of the switches $SW_1$ through $SW_{10}$ is closed, the switch SW will simultaneously be closed and the oscillator 19 will immediately be keyed on since it receives a bias from the battery E through the switch SW and the resistor R. During this initial period, the transistor Q does not conduct. After a time interval as determined by which one of the switches $SW_1$ through $SW_{10}$ is depressed, transistor Q will be turned on thus dropping the collector of transistor Q to almost ground potential which immediately turns off the oscillator 19. During the time interval T, the oscillator 19 supplies its output signal to the electrical-sound converter 20 which, for example, generates an ultrasonic wave with a frequency of 40KHz. The resistance values of the resistors $R_1$ through $R_{10}$ and the value of the capacitor C are selected such that the voltage across the base-emitter is determined by the time constant of the resistors and the capacitor and by the voltage value of the battery E is such that the following turn-on times for the oscillator 19 are obtained.

Table

| Push Button Type Switch | Time Period |
| --- | --- |
| $SW_1$ | $T_1 = 1.3^0 t_0 = 1.0\ t_0$ |
| $SW_2$ | $T_2 = 1.3^1 t_0 = 1.3\ t_0$ |
| $SW_3$ | $T_3 = 1.3^2 t_0 = 1.7\ t_0$ |
| $SW_4$ | $T_4 = 1.3^3 t_0 = 2.2\ t_0$ |
| $SW_5$ | $T_5 = 1.3^4 t_0 = 2.9\ t_0$ |
| $SW_6$ | $T_6 = 1.3^5 t_0 = 3.8\ t_0$ |
| $SW_7$ | $T_7 = 1.3^6 t_0 = 4.9\ t_0$ |
| $SW_8$ | $T_8 = 1.3^7 t_0 = 6.4\ t_0$ |
| $SW_9$ | $T_9 = 1.3^8 t_0 = 8.3\ t_0$ |
| $SW_{10}$ | $T_{10} = 1.3^9 t_0 = 10.7\ t_0$ |

By way of example, the unit time intervals $t_0$ may be selected to be 10 ms (milli-seconds).

It is to be particularly noted that, as shown by the Table, the time constants established by the resistors $R_1$-$R_{10}$ are exponentially related to each other and that they do not vary linearly as has been common in the prior art.

A receiver 15 is also disclosed in FIG. 2 and includes an ultrasonic wave-electrical converter 2 which receives the energy radiated by the converter 20 and supplies an input to an amplifier 3. The amplifier 3 supplies an input to a band pass filter 4 which may in the particular example have a pass band of 40KHz. A detector circuit 5 receives the output of filter 4 and detects it. A reference pulse generator 6 receives the output of the detector 6 and supplies an input to a counter 9. A reset circuit 7 also receives the output of the detector 5 and supplies inputs to the reset terminals of the flip-flop circuits 9a, 9b, 9c, and 9d of the counter circuit 9. A decoder 10 is connected to the outputs of the flip-flops 9a, 9b, 9c, and 9d of the counter 9 and converts the binary input into n outputs which appear on n output terminals of the decoder 10. A plurality of AND circuits $11_1$, $11_2$, $11_x$, $11_n$ receive inputs from separate n outputs of the decoder 10 and also receive inputs from a gate generator 8 which receives an input from the detector 5. The output terminals $12_1$, $12_2$, $12_x$, $12_n$ of the AND circuits 11 are connected to a controlled device 21.

FIG. 3A illustrates an ultrasonic wave $S_O$ which is emitted from the transmitter 1 and wherein the length of this pulse determines the intelligence being transmitted. The wave $S_0$ is received by the receiver and converted into the pulse $S_1$ having a length of $T_3$ illustrated in FIG. 3B. The pulse signal $S_1$ is supplied to the reference pulse generator 6, the reset circuit 7, and the gate generator 8.

The reference generator 6 oscillates for the time $T_3$ during which time the signal $S_1$ is supplied to its input and the output of the oscillator 6 is illustrated in FIG. 3C and is designated as $C_P$. The period of the reference signal pulse $C_P$ is selected to be $1/10\ t_0$ and a total number of reference pulses $C_P$ of 10 times 1.7 or 17 are produced for the time interval $T_3$. Thus, in the illustrated example, 17 reference pulse signals will be generated by the reference pulse generator 6.

The output of the reference pulse generator 6 is connected to the counter 9 and supplies its input to the lowest order flip-flop circuit 9a which has its output connected to the flip-flop 9b which in turn has its output connected to the flip-flop 9c which in turn has its output connected to the flip-flop 9d in conventional counter fashion. The output of each of the flip-flops 9a are applied to the decoder circuit 10 and the output of the counter is binary as for example in a conventional 1-2-4-8 code wherein the flip-flop circuit 9a indicates the first unit output, the flip-flop circuit 9b indicates the two unit output, the flip-flop circuit 9c indicates the four unit output, and the flip-flop circuit 9d indicates the eight unit output.

The decoder circuit 10 has n output terminals where n is equal to the highest number to be decoded and produces an output at its xth output terminal as for example in the assumed example the 15th output terminal corresponding to the counted value of x of the counter 9.

During the time until the control pulse is produced at the 15th output terminal of the decoder 10, pulse signals will be sequentially produced at the first through the fourteenth output terminals of the decoder 10. The output terminals of the decoder 10 are connected to one input of the AND circuits $11_1$, $11_2$, ... $11_n$ and the other input terminals of the AND gates are connected to the output terminal of the gate signal generator circuit 8. However, the gate signal generator circuit 8 produces a gate signal $P_g$ illustrated in FIG. 3E which is generated at the trailing edge of the pulse signal $S_1$ which is applied to all of the AND circuits $11_1$ to $11_n$; and thus, only the 15th AND circuit $11_{15}$ will produce an output at its output terminal $12_{15}$.

The reset circuit 7 produces a reset pulse $P_r$ illustrated in FIG. 3D which is generated at the leading edge of the pulse signal $S_1$ which is applied to the counter 9 to reset all of the flip-flop circuits 9a–9d immediately before the reference pulse $C_P$ is generated.

As a result, the control pulse signal will be obtained at the xth output terminal $12_x$ from the AND circuits 11 and the xth output terminal $12_x$ is determined by the duration of the oscillator time interval Tx of the ultrasonic wave emitted from the transmitter 1. Thus, the presence of a signal on a particular one of the output terminals $12_1$-$12_n$ indicates the intelligence being transmitted and all of the output terminals can be connected to a controlled device 21 which will be controlled by the particular output received.

The controlled device might be an electronic tuner such as a variable capacity diode or other device or the output signal could energize any conventional switching means.

Figure 4A:
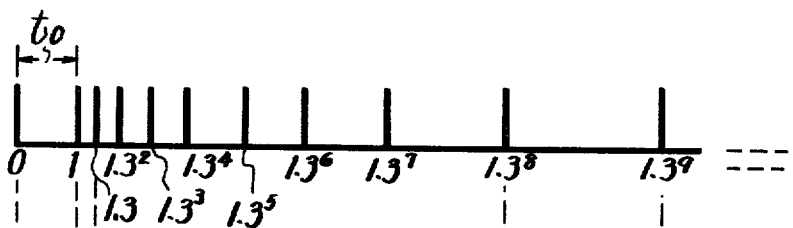
Figure 4B:
Figure 4C:
Figure 4D:
Figure 4E:

FIGS. 4A through 4E illustrate the waveforms of the information signals generated in the transmitter 1. FIG. 4A illustrates a time axis with a unit time interval of $t_0$. FIG. 4B illustrates an ultrasonic wave wherein the time interval is $T_2 = 1.3^1 t_0$. FIG. 4C illustrates a time interval of $T_1 = 1.3^0 t_0 = 1.0 t_0$. FIG. 4D is a time interval which equals $T_{10} = 1.3^9 t_0$; and FIG. 4E, the time interval is equal to $T_9 = 1.3^8 t_0$. It is to be particularly noted that the ratio of the duration of the time intervals of the adjacent order signals are all in the ratio of 1.3:1. This can be observed by comparing the outputs of FIGS. 4B and 4C, as well as FIGS. 4D and 4E. Although not specifically shown in the drawings, the ratio of the time duration of all the other adjacent signals is 1.3:1.

Thus, the present invention provides an improved control system wherein the transmitter produces and transmits time signals having lengths and wherein the ratio of adjacent time signals is 1.3:1. The receiver receives the information signals from the transmitter and counts the duration time intervals of the received signals and produces a readout indicative of the content of the information signals. There is also provided duration time interval variable control means in the receiver so as to exponentially change the duration time intervals of the frequency signals of the information so as to detect the intelligence being transmitted. The ratio of the duration time intervals of adjacent information signals is made constant and is independent of the duration of the time intervals and thus information signals will not be interchanged. Thus, errors will not occur in the transmission or detection and reception of the information.

Although the present embodiment assumes that an ultrasonic signal is emitted from the transmitter and received by single receivers, it is to be realized, of course, that electrical signals can be used instead of the ultrasonic wave carrier. Also, it is to be realized that a number of receivers could be controlled by a single transmitter, or alternatively, a number of transmitters could be utilized to independently control one or more receivers.

It is also possible to utilize this system with a carrier of laser light, infrared rays, or any other carrier instead of the illustrated ultrasonic wave.

Although the invention has been described with respect to preferred embodiments, it is not to be so limited as changes and modifications may be made which are within the full intended scope as defined by the appended claims.

I claim as my invention:

1. A pulse duration transmission system for transmitting intelligence comprising, means for selectively transmitting at least one of a plurality of available pulse signals of different discrete pulse durations such that the ratio of pulse durations between one pulse to another pulse is $A^n$ where A is a fixed number and $n$ is a parameter, and means for receiving said at least one signal and detecting said intelligence as determined by said pulse durations, and wherein said receiving means comprises a detector receiving said transmitted pulses and producing corresponding pulses having the same time duration as said transmitted pulses, a reference pulse generator receiving the output pulses of said detector and producing a pulse train for a period equal to the duration of the detector output for each transmitted pulse, a counter receiving said pulse trains from said reference pulse generator to count the number of pulses therein, a decoder connected to said counter and having a plurality of output terminals to decode said count, a plurality of AND gates each connected to one of the output terminals of said decoder, a gate generator receiving the output pulses of said detector and producing a pulse output at the trailing edge of each of said output pulses of said detector and supplying said gate generator pulse outputs to each of said plurality of AND gates.

2. A pulse duration modulation system according to claim 1 including a reset circuit connected to said detector and to said counter.

3. A pulse duration modulation system according to claim 1 wherein said transmitting means comprises an oscillator selectively keyed to produce an output signal, and a keying means connected to said oscillator to control the time duration of its output.

4. A pulse duration modulation system according to claim 3 wherein said keying means includes a first switch, a bias means connected to said first switch and said oscillator to activate said oscillator, a plurality of switches each ganged to said first switch and connected to said bias means, a plurality of time constant circuits respectively connected to said oscillator and to said plurality of switches such that upon closing of a selected one of said plurality of switches said oscillator will produce an output pulse.

5. A system for transmitting information comprising a transmitter and at least one receiver:

said transmitter including:
a. means for producing a plurality of control signals one at a time for remote control,
b. means for producing a carrier having a predetermined constant frequency;
c. means for width modulating said carrier in sequence with said plurality of control signals to produce at least one of a plurality of available carrier modulated pulse signal sequences comprising carrier pulses of different discrete pulse widths such that the ratio of pulse widths between any one carrier pulse and another carrier pulse is $A^n$ where A is a fixed number and n is a parameter,
d. means for transmitting said modulated carrier from said modulating means; said receiver including: :
e. means for receiving said modulated carrier;
f. means for detecting said modulated carrier, said detecting means converting said modulated carrier to a sequence of pulse signals with pulse widths proportional to the pulse widths of said modulated carrier; and
g. a controlled means responsive to said detecting means and producing output signals corresponding to said plurality of control signals.

6. A system for transmitting information according to claim 5 wherein said controlled means includes pulse signal generator means for producing a pulse train for each pulse signal of said detected sequence.

7. A system for transmitting information according to claim 6 wherein said controlled means includes binary counter means for counting the number of pulses from said pulse generator means for each pulse train and decoding means for converting an output signal from said counter means into a decimal code, and a controlled device receiving an output signal from said decoding means.

8. A system for transmitting information according to claim 5, wherein said carrier signal is in the ultrasonic frequency range.

9. A system for transmitting information according to claim 8, wherein said means for transmitting said modulated carrier comprises an electric-ultrasonic converter.

10. A system for transmitting information according to claim 9, wherein said means for receiving said modulated signal comprises an ultrasonic-electric converter.

11. A system for transmitting information according to claim 10, wherein said electric-ultrasonic converter comprises a ceramic resonator.

* * * * *